United States Patent [19]

Jiang

[11] Patent Number: 5,925,260
[45] Date of Patent: Jul. 20, 1999

[54] REMOVAL OF POLYIMIDE FROM DIES AND WAFERS

[75] Inventor: Tongbi Jiang, Boise, Id.

[73] Assignee: Micron Technology, Inc., Boise, Id.

[21] Appl. No.: 08/778,324

[22] Filed: Jan. 2, 1997

[51] Int. Cl.$^6$ .................................................. B32B 31/00
[52] U.S. Cl. ................................... 216/7; 216/85; 438/8; 438/15
[58] Field of Search .................. 216/7, 83, 84, 216/85, 90, 95; 438/8, 14, 15, 110, 115, 118, 120, 123, 746, 780, FOR 142

[56] References Cited

U.S. PATENT DOCUMENTS

| | | | |
|---|---|---|---|
| 3,661,660 | 5/1972 | Wessells et al. | 156/14 |
| 3,871,930 | 3/1975 | Fish | 156/3 |
| 3,962,004 | 6/1976 | Sonneborn | 156/11 |
| 4,411,735 | 10/1983 | Belani | 156/659.1 |
| 4,428,796 | 1/1984 | Milgram | 156/637 |
| 4,451,971 | 6/1984 | Milgram | 29/578 |
| 4,835,120 | 5/1989 | Mallik et al. | 437/209 |
| 4,918,811 | 4/1990 | Eichelberger et al. | 29/840 |
| 4,957,583 | 9/1990 | Buck et al. | 156/345 |
| 5,286,679 | 2/1994 | Farnworth et al. | 437/209 |
| 5,350,487 | 9/1994 | Ameen et al. | 156/642 |
| 5,555,234 | 9/1996 | Sugimoto | 354/317 |
| 5,766,808 | 6/1998 | Linde et al. | 430/15 |

FOREIGN PATENT DOCUMENTS

| | | |
|---|---|---|
| 60-182134 | 9/1985 | Japan . |
| 2-16747 | 1/1990 | Japan . |
| 3-73534 | 3/1991 | Japan . |
| 4-174533 | 6/1992 | Japan . |
| 4-221839 | 8/1992 | Japan . |

OTHER PUBLICATIONS

Fischer, David et al., "Applications Page", Copyright (C) 1995 Polymicro Technologies, Inc., Updated: Aug. 21, 1995.

*Primary Examiner*—R. Bruce Breneman
*Assistant Examiner*—Anita Alanko
*Attorney, Agent, or Firm*—Hale and Dorr LLP

[57] ABSTRACT

Polyimide is used with a semiconductor wafer with a number of dies with circuitry formed thereon. A layer of polyimide is formed on the semiconductor wafer. The wafer is inspected to determine whether the layer of polyimide was formed in a desired pattern. Based on the results of the inspection, the layer of polyimide is removed. A layer of polyimide is removed from a semiconductor substrate with circuitry formed thereon. The semiconductor substrate is provided in a container with a solvent. Energy is introduced to the substrate from a frequency-based energy source. A rinse agent is applied to the substrate.

19 Claims, 2 Drawing Sheets

REMOVAL OF POLYIMIDE FROM DIES AND WAFERS

STATEMENT OF GOVERNMENT RIGHTS

This invention was made with Government support under Contract No. DABT63-93-C-0025 awarded by the Advanced Research Projects Agency (ARPA). The Government may have certain rights in this invention.

BACKGROUND OF THE INVENTION

The present invention relates generally to the packaging of semiconductors, and more specifically to attaching dies to lead frames.

U.S. Pat. No. 5,286,679 discloses a method for patterning polyimide on a surface of a semiconductor wafer in a number of discrete regions. The polyimide is used as an adhesive for attaching a die to a lead frame. The regions of polyimide are patterned to avoid covering saw streets where the wafer will be sawed to make up the individual dies. After the wafer is sawed, the individual dies can be mounted on a lead frame using one of a number of known processes, such as a lead-on-chip (LOC) or a lead-under-chip (LUC) process.

If the patterning of polyimide on the wafer is not performed accurately, it can cause problems at the saw; moreover, visual recognition of the die attach will note a defect if polyimide is bridging the saw street and/or the bond pad area. Defects in the adhesive pattern also cause poor die attachment. Polyimide is very difficult to remove without also damaging circuitry formed in the wafer. Consequently, a wafer would typical be discarded rather than reworked. To avoid the waste of having to discard the wafer, it would be desirable to have a method for removing such polyimide without damaging the substrate.

Similar problems can arise after a die is bonded to a lead frame. In some cases, due to a defective lead frame or due to poor patterning of the polyimide, the die attachment may be ineffective. It would be desirable to be able to rework the die and the lead frame to save them rather than requiring that they be discarded.

SUMMARY OF THE INVENTION

The present invention includes a method for reworking a wafer with patterned polyimide as an adhesive or a die mounted on a lead frame using polyimide as an adhesive.

According to the invention, polyimide is patterned on a wafer and then is typically inspected to make sure that the patterning was performed properly. If such an inspection reveals problems with the patterning, the polyimide on the wafer is removed by putting the wafer in a solvent and by providing a frequency-based energy to the wafer in the solvent, preferably ultrasonic agitation. The solvent and the wafer are preferably also heated. The inspection can be performed visually or with an automated machine vision system. To introduce ultrasonic energy, the wafer with the polyimide is put into a container with a solvent, and the container of solvent is put into a bath of an ultrasonic cleaning instrument.

In another aspect of the invention, after a die is mounted to a lead frame with polyimide, the die and lead frame are inspected. If the attachment was made in an undesirable manner, the die is separated from the lead frame with a solvent and preferably also with ultrasonic agitation as described above.

The present invention provides a convenient and efficient way to rework a wafer or a die attached to a lead frame without damaging the underlying circuitry on the wafer or the saw street and bond pad area and while saving costs by using otherwise unusable dies or wafers. The methods of the present invention are inexpensive and easy to perform. Other features and advantages will become apparent from the detailed description, drawings, and claims.

DETAILED DESCRIPTION

Figure 1:
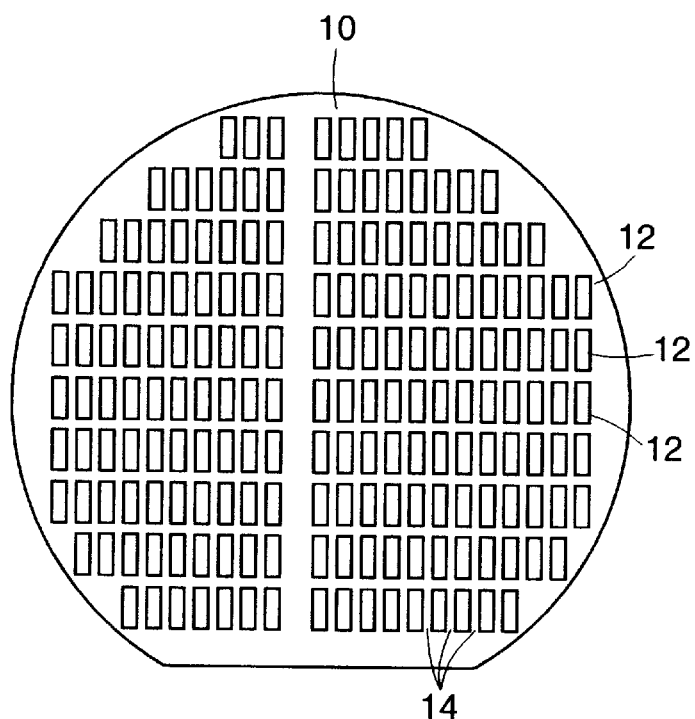
FIGS. 1 and 2 are a plan view and side view illustrating a pattern of polyimide on a wafer according to a known method.
Figure 2:
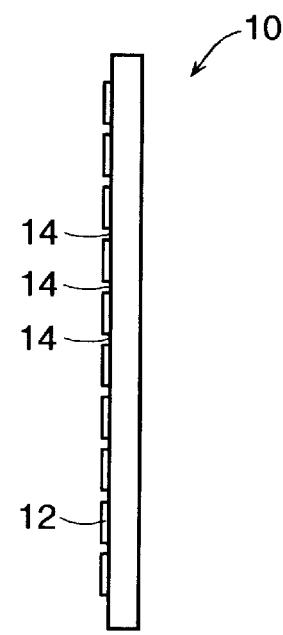

Referring to FIGS. 1 and 2, a wafer 10 has a layer of polyimide formed in patterned arrangement in a large number of discrete regions 12 as shown in U.S. Pat. No. 5,286,679, which is incorporated herein by reference for all purposes. The regions of polyimide are patterned to avoid saw streets 14 between die locations on the wafer. Any commercially available polyimide may be used, such as Du Pont QL 3400 or PI-1111 available from E.I. Du Pont de Nemours and Co. in Wilmington, Del.; Ablestik PI 5500, Ablestik XR-041395-6 and Ablestik XR-041395-10, made by Ablestik, a division of National Starch and Chemical Co., of Rancho Dominguez, Calif.; or Sumioxy 2421-A4-SP-128B, available from OxyChem of Dallas, Tex..

Figure 3:
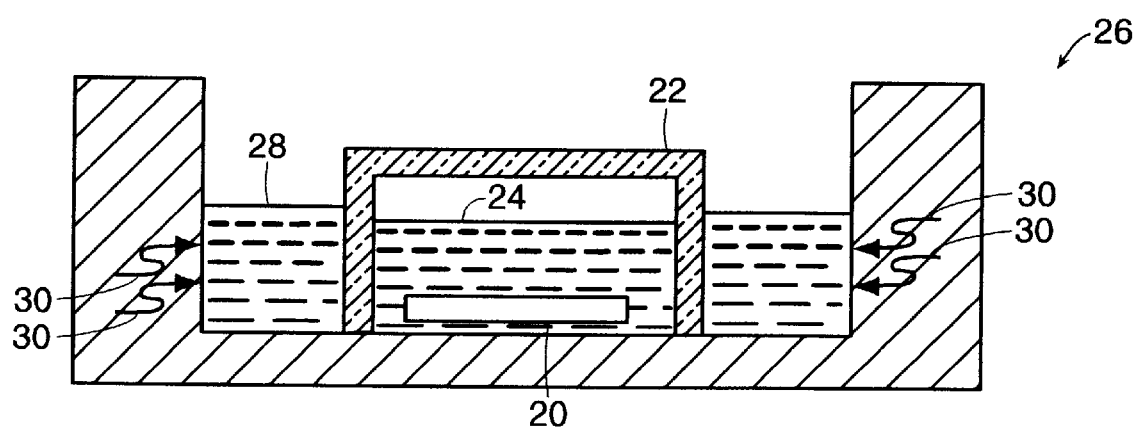
FIG. 3 is a cross-sectional view of a system for cleaning a wafer or die according to the present invention.
Figure 4:
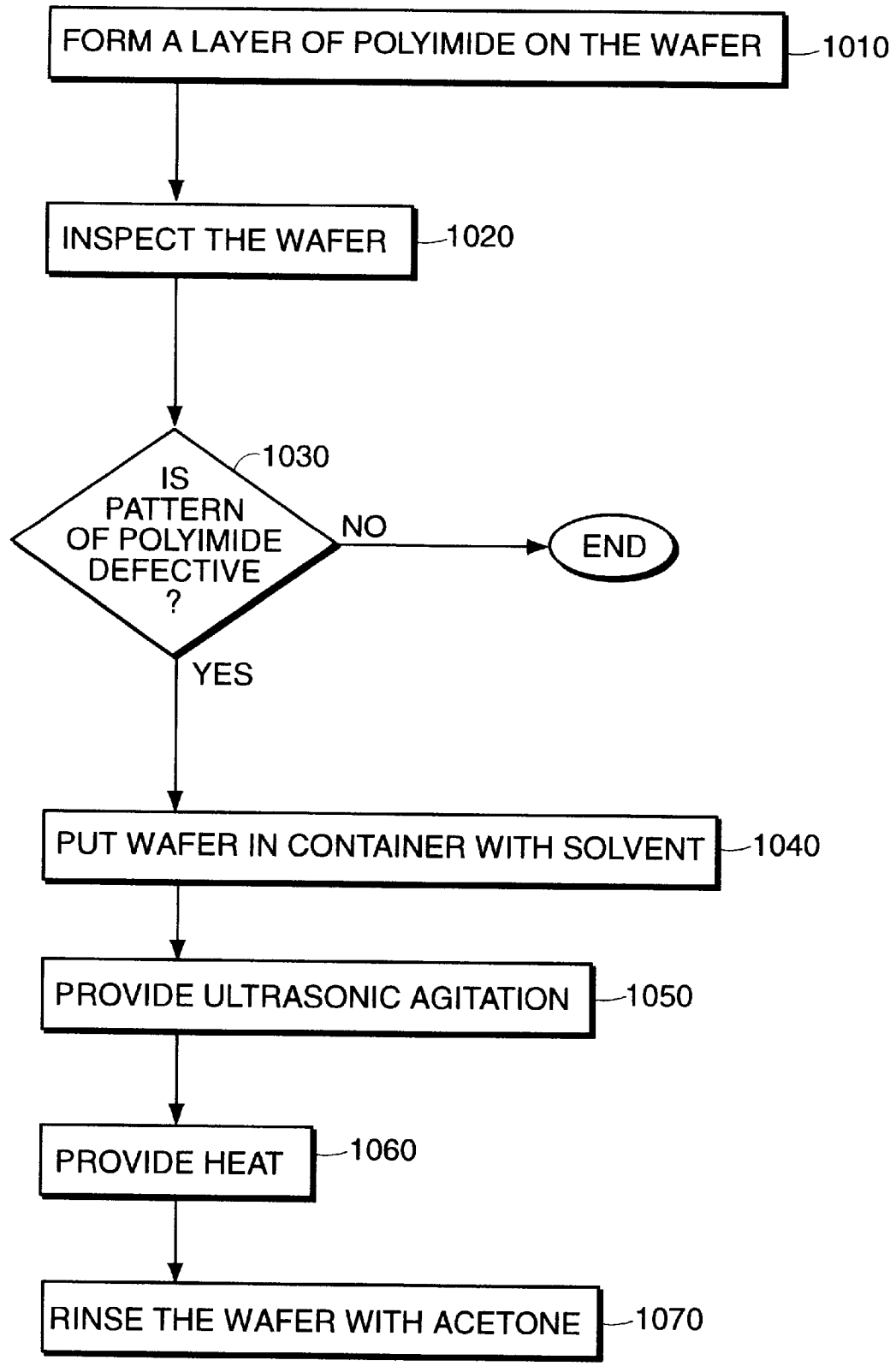
FIG. 4 is a block diagram of a method for using polyimide.

Referring to FIG. 4, after the polyimide layer is formed on the wafer (step 1010), the wafer should be inspected, e.g., by visual observation or with an automated vision system (step 1020). If such inspection reveals that the patterning of the polyimide is defective (step 1030), e.g., if it covers parts of saw sheets or bond pads, the wafer is reworked such that the polyimide layer is removed. Referring to FIG. 3, the workpiece to be reworked, such as a wafer 20, is put into a container 22 with a solvent 24 (step 1040). Container 22 is then provided in an ultrasonic cleaning instrument 26 that provides ultrasonic agitation (step 1050). This instrument has a bath that includes a container for holding water 28, and an energy source (not shown) for generating ultrasonic energy, represented by arrows 30. Ultrasonic energy is a type of frequency-based energy provided by sound waves at a frequency above the audible range, i.e., greater than 20 KHz, with "frequency-based meaning an energy with waves at some frequency, unlike thermal energy.

A preferred solvent is n-methyl-pyrrolidone (NMP) ($C_5H_9NO$), a commonly available solvent known to have other uses in semiconductor manufacturing. The solvent is heated above room temperature, to at least about 89° F. (step 1060). After the cleaning step performed in instrument 26, the wafer can then be rinsed, e.g., with acetone, to wash out the residual (step 1070).

In another aspect of the present invention, the wafer is sawed and individual dies are attached to a lead frame in a known manner, such as using an LOC or an LUC method. If, after die attachment, inspection reveals that a die is improperly attached to a lead frame, the die and the lead frame are put together in a container with a solvent and subjected to ultrasonic agitation as described above in connection with FIG. 3. Thus the workpiece in FIG. 3 would be a die with a lead frame. The die and the lead frame are thereby separated, and the die can be reused while the lead frame can either be reused or discarded as desired (lead frames are typically inexpensive).

In one experiment, dies with layers of three different polyimides (Ablestik XR-041395-6, Ablestik XR-041395-10, and Sumioxy 2421-A4-SP-128B) at thickness of about 1.2 to 1.5 mils were soaked in NMP for 18 hours. This soaking removed much, but not all, of the polyimide from the dies.

In another experiment, dies with the same polyimides and similar thicknesses were put in a beaker with NMP, and the beaker was put in a water bath of a Bransonic model 1210 ultrasonic cleaning instrument, a commercially available device that was operated in its normal manner. The water in the bath was heated to about 89° F. (about 32° C.), although it could be heated to higher temperatures and up to about 187° F. (86° C.), the flash point of NMP. Temperatures lower than 32° C. may be possible, but it is believed that low temperatures might not be effective. In the ultrasonic cleaning instrument, all polyimide was completely removed from the dies in about 20 minutes. The dies were rinsed with acetone twice to remove the residual. Tests found no carbonyl signal, and visual inspection showed no polyimide left. In some cases, the polyimide was completely removed in as little as 10 minutes. Accordingly, while the solvent alone had some effect, the ultrasonic agitation appeared to remove all of the polyimide without damaging the circuitry on the die.

Depending on the dies, the polyimide, and the solvent used, the soaking time, the temperature, and the energy or type of agitation may be different. These parameters could be developed and optimized with experience.

While this experiment was performed at the die level, a similar process could be used at the wafer level to remove polyimide patterned on wafers as shown in FIGS. 1–2.

Having described embodiments of the invention, it should be apparent that modifications can be made without departing from the scope of the invention as defined by the appended claims. While described with wafers, polyimide can be removed similarly from silica fiber or silica capillary tubes, and can be used with chip on board, flip-chip, or ball grade array.

What is claimed is:

1. A method for using polyimide with a semiconductor wafer with a number of dies with circuitry formed thereon, the method comprising the steps of:

forming a layer of polyimide on the semiconductor wafer with a number of dies, with circuitry formed thereon;

inspecting the wafer to determine whether the layer of polyimide was formed in a desired pattern; and based on the results of the inspection, removing the layer of polyimide.

2. The method of claim 1, wherein the removing step comprises the steps of:

providing the wafer in a solvent in a container; and providing a frequency-based energy from an external source to the container.

3. The method of claim 2, wherein the step of providing frequency-based energy includes providing the container in a bath of an instrument for ultrasonically agitating the container, and providing ultrasonic energy.

4. The method of claim 2, wherein the solvent comprises NMP.

5. The method of claim 2, further comprising heating the wafer and the solvent while providing the frequency-based energy.

6. The method of claim 1, further comprising heating the wafer.

7. The method of claim 1, wherein the inspecting step comprises visual inspection.

8. The method of claim 1, wherein the inspecting step comprises inspection performed with a machine inspection system.

9. A method for removing a layer of polyimide from a semiconductor substrate with circuitry formed thereon, the method comprising providing the semiconductor substrate in a container with a solvent, introducing energy to the substrate from a frequency-based energy source, and applying a rinse agent to the substrate.

10. The method of claim 9, wherein the semiconductor substrate comprises a die attached to a lead frame with the polyimide as an adhesive to connect the die and the lead frame.

11. The method of claim 9, wherein the semiconductor substrate comprises a wafer with polyimide patterned thereon.

12. The method of claim 9, wherein the energy source provides ultrasonic energy.

13. The method of claim 12, wherein at least some of the ultrasonic energy is provided by an ultrasonic cleaning instrument that has a container holding a liquid, the introducing step including providing the container with the substrate and solvent in the container in the instrument.

14. The method of claim 9, wherein the providing step includes putting the substrate in a container with NMP.

15. A method for removing polyimide from a workpiece, the method comprising the steps of:

providing the workpiece with the polyimide in a container with a solvent;

introducing energy having a frequency to the workpiece in the container; and applying a rinse agent to the workpiece.

16. The method of claim 15, wherein the step of introducing includes introducing energy at a frequency greater than 20 KHz.

17. The method of claim 16, wherein the introducing step further includes providing the container in a bath of an ultrasonic cleaning instrument.

18. The method of claim 17, wherein the providing step includes providing the workpiece in a container with NMP.

19. The method of claim 15, wherein the providing step includes providing the workpiece in a container with NMP.

* * * * *